United States Patent
Chen (10) Patent No.: US 7,774,676 B2
(45) Date of Patent: *Aug. 10, 2010

(54) METHODS AND APPARATUSES FOR GENERATING ERROR CORRECTION CODES

(75) Inventor: Hong-Ching Chen, Kao-Hsiung Hsien (TW)

(73) Assignee: MediaTek Inc., Science-Based Industrial Park, Hsin-Chu (TW)

( * ) Notice: Subject to any disclaimer, the term of this patent is extended or adjusted under 35 U.S.C. 154(b) by 949 days.

This patent is subject to a terminal disclaimer.

(21) Appl. No.: 11/532,112

(22) Filed: Sep. 15, 2006

(65) Prior Publication Data

US 2007/0022358 A1    Jan. 25, 2007

Related U.S. Application Data

(63) Continuation-in-part of application No. 11/160,263, filed on Jun. 16, 2005, now Pat. No. 7,430,701.

(60) Provisional application No. 60/743,072, filed on Dec. 23, 2005.

(51) Int. Cl.
*H03M 13/00* (2006.01)
(52) U.S. Cl. .................. 714/755; 714/784; 714/786
(58) Field of Classification Search .......... 714/755, 714/786, 784
See application file for complete search history.

(56) References Cited

U.S. PATENT DOCUMENTS

| 3,678,469 A | 7/1972 | Freeman |
| 4,547,882 A | 10/1985 | Tanner |
| 4,723,243 A | 2/1988 | Joshi |
| 4,866,717 A * | 9/1989 | Murai et al. ............. 714/765 |
| 5,040,179 A | 8/1991 | Chen |
| 5,276,827 A | 1/1994 | Delaruelle |
| 5,325,372 A | 6/1994 | Ish-Shalom |
| 5,335,234 A | 8/1994 | Matteson |
| 5,383,204 A | 1/1995 | Gibbs |
| 5,408,478 A | 4/1995 | Ohmori |
| 5,878,057 A | 3/1999 | Maa |
| 5,974,580 A | 10/1999 | Zook |
| 6,131,178 A | 10/2000 | Fujita |
| 6,195,780 B1 | 2/2001 | Dravida |
| 6,260,169 B1 | 7/2001 | Massoudi |
| 6,332,206 B1 | 12/2001 | Nakatsuji |
| 6,530,057 B1 | 3/2003 | Kimmitt |
| 6,615,387 B1 | 9/2003 | Williamson |
| 6,651,208 B1 | 11/2003 | Tran |
| 6,718,506 B1 | 4/2004 | Sebastian et al. |
| 7,103,832 B2 | 9/2006 | Leonard |
| 7,328,396 B2 | 2/2008 | Mann |
| 2002/0002693 A1 | 1/2002 | Sankaran |

(Continued)

FOREIGN PATENT DOCUMENTS

TW    417360    1/2001

*Primary Examiner*—Guy J Lamarre
(74) *Attorney, Agent, or Firm*—Winston Hsu (57) ABSTRACT

Methods and apparatuses for generating error correction codes of a data block are disclosed. One proposed method includes: storing a plurality of calculating data corresponding to the error correction codes in a buffer; generating operating results according to the calculating data from the buffer and corresponding data of the data block; writing operating results into the buffer; and generating a plurality of updated calculating data according to the operating results stored in the buffer.

26 Claims, 8 Drawing Sheets

U.S. PATENT DOCUMENTS

2002/0073376 A1 6/2002 Otake
2004/0163031 A1 8/2004 Moriwaki
2005/0193317 A1 9/2005 Chen et al.

* cited by examiner

METHODS AND APPARATUSES FOR GENERATING ERROR CORRECTION CODES

CROSS REFERENCE TO RELATED APPLICATIONS

This is a continuation-in-part of U.S. patent application Ser. No. 11/160,263 filed on Jun. 16, 2005, which is included herein by reference, and claims the benefit of U.S. Provisional Application No. 60/743,072 filed on Dec. 23, 2005.

BACKGROUND

The present invention relates to error correction techniques, and more particularly, to methods and apparatuses for generating error correction codes corresponding to data with a block configuration.

In data storage systems or data transmission systems, error correction mechanisms are important for improving the correctness of data. For example, source data to be recorded into an optical disc need to be encoded to generate corresponding error correction codes. Those error correction codes are then recorded into the optical disc together with the source data so that the data reproducing system is able to check and correct errors within the data retrieved from the optical disc according to the error correction codes.

Figure 1:
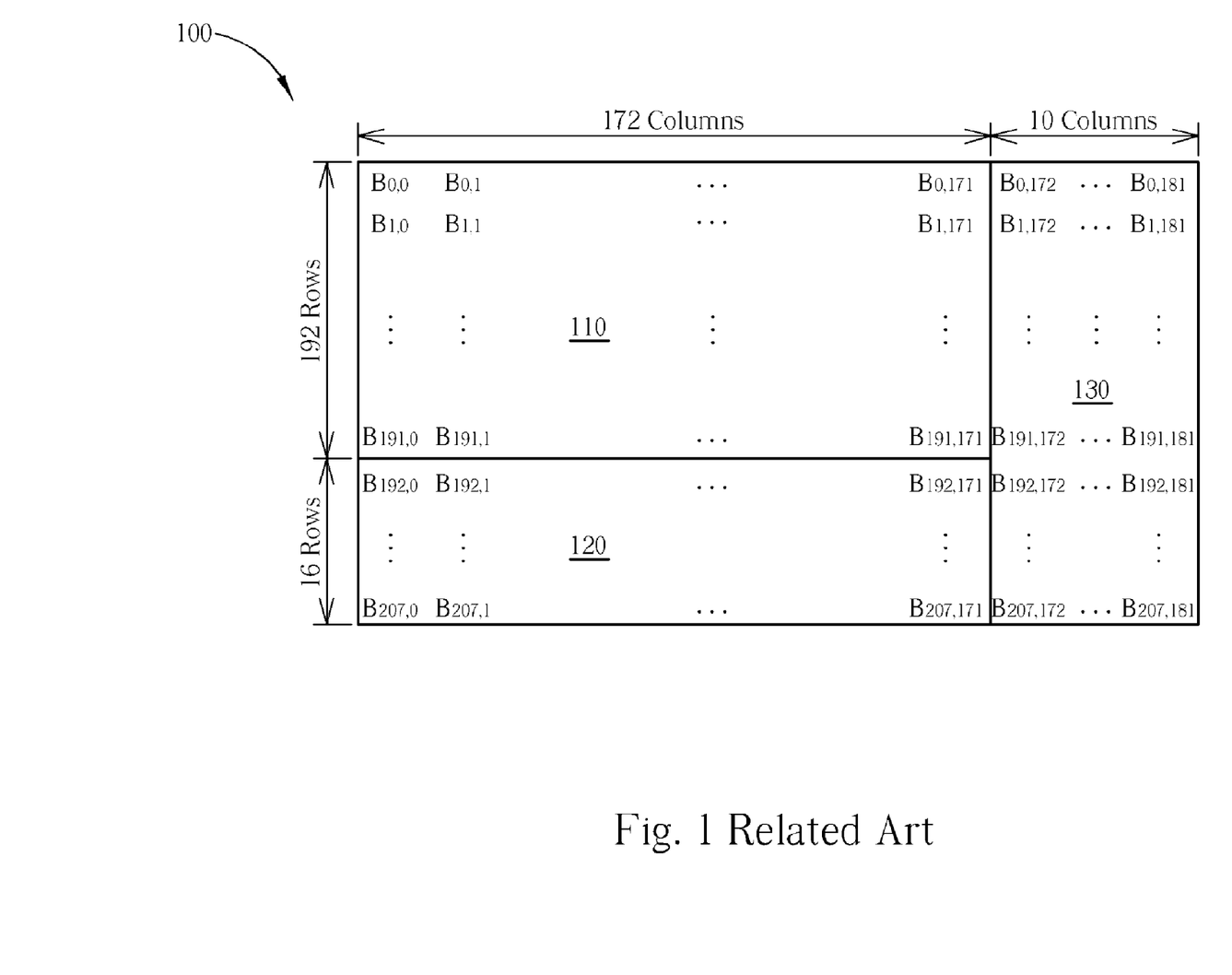
FIG. 1 is an ECC block of a standard digital versatile disc (DVD) or a high definition DVD (HD-DVD) according to the related art.

FIG. 1 shows a typical ECC block 100 of a standard digital versatile disc (DVD) or a high definition DVD (HD-DVD). As illustrated, elements in the ECC block 100 are arranged into 208 rows with 182 columns, wherein each element is one byte. Each row of the ECC block 100 has ten elements of parity inner codes (PI codes) of Reed-Solomon product code (RSPC). For example, elements $B_{0,172}$ through $B_{0,181}$ are the PI codes of the first row of the ECC block 100. In addition, each column j (for j=0~171) of the ECC block 100 has sixteen elements of parity outer codes (PO codes) of RSPC. For example, elements $B_{192,0}$ through $B_{207,0}$ are the PO codes of the first column of the ECC block 100. The ECC block 100 can be divided into three parts: a data block 110, a PO block 120, and a PI block 130. The data block 110 is composed of scrambled source data. The PO block 120 is composed of the PO codes corresponding to the scrambled source data. The PI block 130 is composed of the PI codes corresponding to the scrambled source data. The generation of the PO codes within the PO block 120 can be described by the following remainder polynomial $R_j(X)$:

$$R_j(x) = \sum_{i=192}^{207} B_{i,j} x^{207-i} = \left( \sum_{i=0}^{191} B_{i,j} x^{191-i} \right) x^{16} \bmod G_{po}(x) \quad (1)$$

where $G_{po}(x)$ is the PO generation polynomial.

Before being recorded into a DVD or a HD-DVD, the scrambled source data is encoded for generating the corresponding PO codes and PI codes. The operation for generating the PO codes is referred to as PO encoding while the operation for generating the PI codes is referred to as PI encoding. In the related art, the scrambled source data to be recorded into the DVD or HD-DVD are typically stored in a DRAM (Dynamic Random Access Memory) during the encoding processes. In the conventional PO encoding process, the scrambled source data are sequentially read out from the DRAM column by column for generating the corresponding PO codes. In order to read data elements of a same column from the DRAM, the page-crossing access of the DRAM frequently occurs. Unfortunately, the frequent page-crossing access results in the poor DRAM access efficiency due to the access latency of page miss.

SUMMARY

An exemplary embodiment of an error correction code generator for generating error correction codes corresponding to a first direction of a data block is disclosed comprising: a buffer for storing a plurality of calculating data corresponding to the error correction codes; an operating device coupled to the buffer for generating operating results according to the calculating data from the buffer and corresponding data of the data block, and writing operating results into the buffer; and an encoder coupled to the buffer for generating a plurality of updated calculating data according to the operating results stored in the buffer.

An exemplary embodiment of a method for generating error correction codes corresponding to a first direction of a data block is disclosed comprising: storing a plurality of calculating data corresponding to the error correction codes in a buffer; generating operating results according to the calculating data from the buffer and corresponding data of the data block; writing operating results into the buffer; and generating a plurality of updated calculating data according to the operating results stored in the buffer.

An exemplary embodiment of an error correction code generator for generating error correction codes corresponding to a data block is disclosed comprising: a first buffer for storing a plurality of data of the data block; a second buffer for storing a plurality of calculating data corresponding to the error correction codes; an operating device, coupled to the first buffer and the second buffer, for generating operating results according to the calculating data from the second buffer and the plurality of data from the first buffer; and an encoder coupled to the operating device for generating a plurality of updated calculating data according to the operating results.

An exemplary embodiment of a method for generating error correction codes corresponding to a data block is disclosed comprising: storing a plurality of data of the data block in a first buffer; storing a plurality of calculating data corresponding to the error correction codes in a second buffer; generating operating results according to the calculating data from the second buffer and the plurality of data from the first buffer; and generating a plurality of updated calculating data according to the operating results.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to ...". Also, the term "couple" is intended to mean either an indirect or direct electrical connection. Accordingly, if one device is coupled to another device, that connection may be through a direct electrical connection, or through an indirect electrical connection via other devices and connections.

Figure 2:
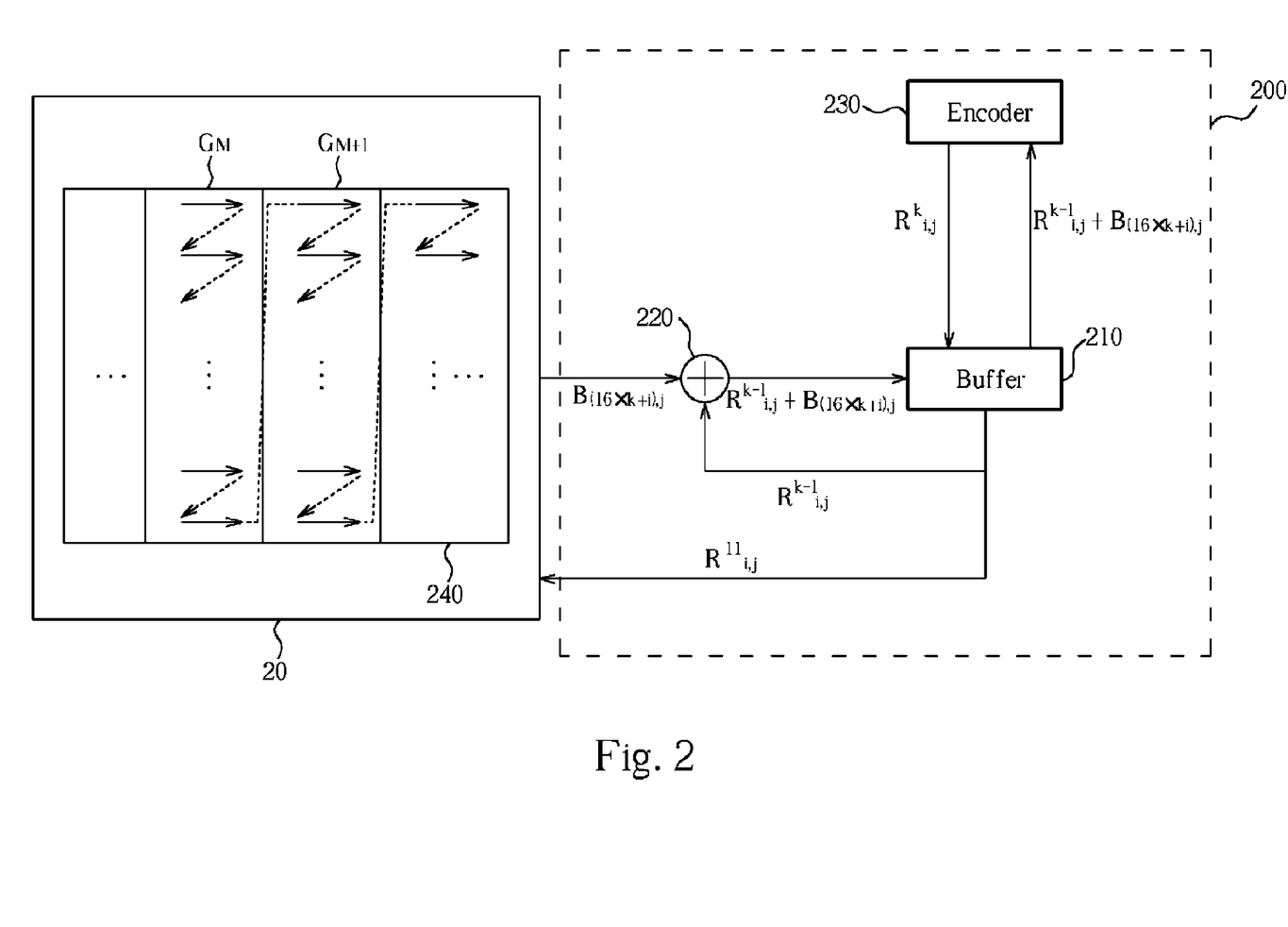
FIG. 2 is a simplified block diagram of an error correction code generator according to a first embodiment of the present invention.

Please refer to FIG. 2, which shows a simplified block diagram of an error correction code generator 200 according to a first embodiment of the present invention. As shown, the error correction code generator 200 comprises a buffer 210, an operating device 220, and an encoder 230. As illustrated, the operating device 220 and the encoder 230 are coupled to the buffer 210. During operation, the error correction code generator 200 accesses data of a data block 240 from a memory 20 to generate corresponding error correction codes of the data block 240. The placement of the data block 240 in the memory 20 is arranged to make the probability of page miss as low as possible when the data block 240 is accessed along with the row direction of the data block 240. The error correction code generator 200 can be applied in various optical storage systems or communication systems. For convenience of description, it is herein assumed that the error correction code generator 200 is applied in an optical storage device for generating PO codes corresponding to a data block to be recorded into an optical disc such as a DVD or a HD-DVD. In practice, the memory 20 is typically a DRAM, such as the system memory of the optical storage device applying the error correction code generator 200.

The PO encoding operation made by the error correction code generator 200 can be expressed by the following recursive remainder polynomial $R^k_j(X)$ for each column j (j=0~171) of the data block 240:

$$R^k_j(x) = \sum_{i=0}^{15} R^k_{i,j} x^{15-i} \quad (2)$$

$$= \left( R^{k-1}_j(x) + \sum_{i=0}^{15} B_{(16 \times k+i),j} x^{15-i} \right) x^{16} \bmod G_{po}(x)$$

$$= \left( \sum_{i=0}^{16 \times k+15} B_{i,j} x^{16 \times +k15-i} \right) x^{166} \bmod G_{po}(x)$$

-continued $$= \left( \sum_{i=0}^{15} (R^{k-1}_{i,j} + B_{(16 \times k+i),j}) x^{15-i} \right) x^{16} \bmod G_{po}(x)$$

where $$R^{-1}_j(x) = 0, R^{11}_j(x) = \left( \sum_{i=0}^{191} B_{i,j} x^{191-i} \right) x^{16} \bmod G_{po}(x) = R_j(x),$$

k is the iteration number, and $G_{po}(x)$ is the PO generation polynomial.

Hereinafter, the operations and implementations of the error correction code generator 200 will be described in more detail with reference to FIG. 3.

Figure 3:
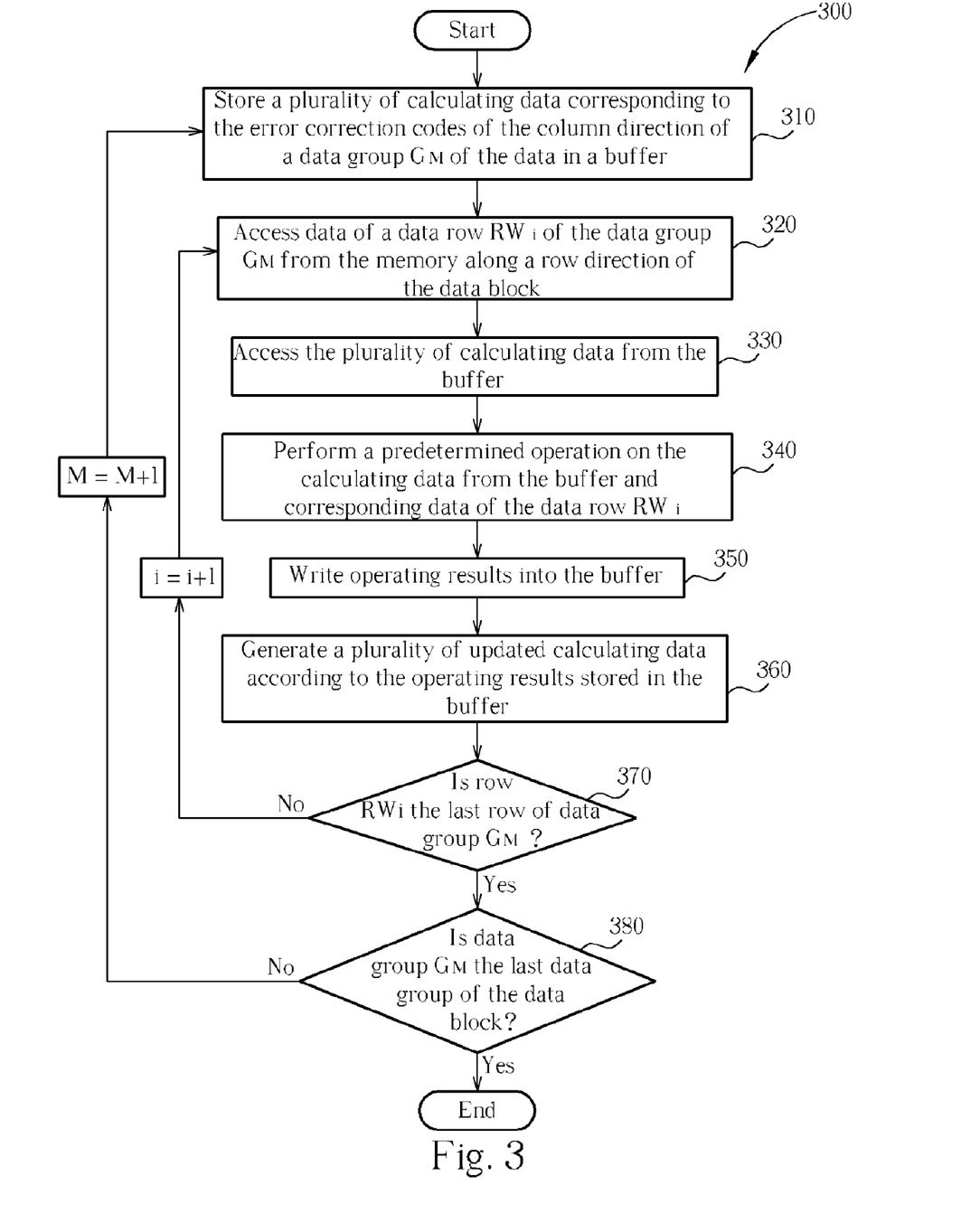
FIG. 3 depicts a flowchart illustrating a method for generating error correction codes corresponding to a data block according to a first embodiment of the present invention.

FIG. 3 depicts a flowchart 300 illustrating a method for generating error correction codes corresponding to a data block according to a first embodiment of the present invention. Steps of the flowchart 300 are described below.

In step 310, the buffer 210 of the error correction code generator 200 stores a plurality of calculating data (i.e., the term $R^{k-1}_{i,j}$ of equation (2) in this case) corresponding to the error correction codes (i.e., the PO codes in this case) of the column direction of a data group GM of the data block 240, wherein the data group GM comprises a plurality of data columns of the data block 240. In a preferred embodiment, the buffer 210 is an SRAM (Static Random Access Memory) having a capacity corresponding to the column number of the data group of the data block 240. For example, if the data group of the data block 240 is composed of 32 columns, the buffer 210 may be implemented with an SRAM having a capacity of 512 (=32×16) bytes. It should be noted that this is merely an example rather than a restriction of the practical implementations.

In step 320, the operating device 220 accesses data of a data row $RW_i$ of the data group $G_M$ from the memory 20 along a row direction of the data block 240.

In step 330, the operating device 220 accesses the plurality of calculating data from the buffer 210.

In step 340, the operating device 220 performs a predetermined operation on the calculating data from the buffer 210 and corresponding data (i.e., the term $B_{(16 \times k+i),j}$ of equation (2) in this case) of the data row $RW_i$ of the data group $G_M$. In one embodiment, the operating device 220 comprises a summing circuit for summing up the calculating data from the buffer 210 with corresponding data to generate the operating results (i.e., the term $R^{k-1}_{i,j} + B_{(16 \times k+i),j}$ of equation (2) in this case). In practice, the summing circuit may be an XOR logic. In other words, the predetermined operation performed by the operating device 220 may be an XOR logical operation.

In step 350, the operating device 220 writes back the operating results of the operating device 220 into the buffer 210. In one embodiment, the operating device 220 overwrites the calculating data stored in the buffer 210 with the operating results.

The encoder 230 then performs step 360 to generate a plurality of updated calculating data (i.e., the term $R^k_{i,j}$ of equation (2) in this case) corresponding to the error correction codes of the column direction of the data group GM of the data block 240 according to the operating results stored in the buffer 210.

In step 370, the error correction code generator 200 determines if the data row RWi is the last row of the data group GM. If the data row RWi is the last row, the error correction code generator 200 proceeds to step 380; otherwise, the error correction code generator 200 repeats steps 320 through 370 for a subsequent data row RWi+1 of the data group GM until all rows of the data group GM are processed completely. After calculating data corresponding to the data group GM are completely updated by the encoder 230, the final updated calculating data (i.e., the term $R^{11}_{i,j}$ of equation (2) in this case) are the error correction codes of the column direction of the data group GM. The error correction codes stored in the buffer 210 can be further written into the memory 20.

In step 380, the error correction code generator 200 determines if the data group $G_M$ is the last data group of the data block 240. If the data group $G_M$ is not the last data group, the error correction code generator 200 repeats steps 310 through 380 for a subsequent data group $G_{M+1}$ of the data block 240 until all the data groups of the data block 240 are completely encoded by the encoder 230.

Due to the corresponding data are summed up with the calculating data and the summed results are stored into the buffer, there is no need to require a data buffer for buffering data read from the memory 20. Such architecture reduces the required buffer size and cost for generating the error correction codes corresponding to a data block.

In practice, the error correction code generator 200 can improve the PO encoding performance by executing the following three actions in one operating cycle: to read $R^{k-1}_{i,j}$ from the buffer 210, to perform an XOR logical operation on it and the data of $B_{(16 \times k+i),j}$ from the memory 20, and to write back the operating result $R^{k-1}_{i,j}+B_{(16 \times k+i),j}$ into the buffer 210. One approach to realize this purpose is to implement the buffer 210 with a two-port SRAM, so that the operating device 220 can read the buffer 210 and write the buffer 210 concurrently. Another approach is to implement the buffer 210 with two single-port SRAMs.

Figure 4:
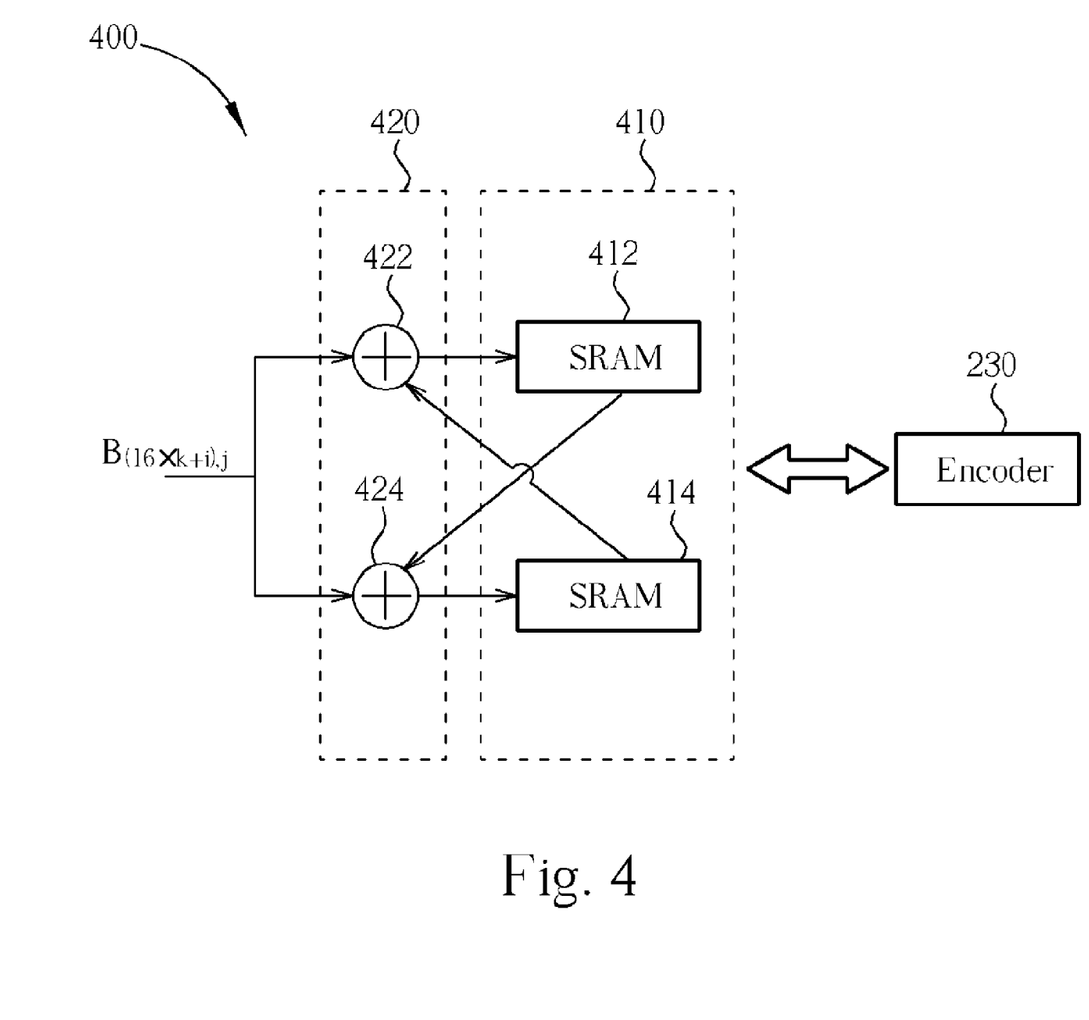
FIG. 4 shows a simplified block diagram of an error correction code generator according to a second embodiment of the present invention.

For example, FIG. 4 shows a simplified block diagram of an error correction code generator 400 according to a second embodiment of the present invention. As shown, the error correction code generator 400 comprises a buffer 410, an operating device 420, and an encoder 430. In this embodiment, the buffer 410 comprises two single-port SRAMs 412 and 414, and the operating device 420 comprises two summing circuits 422 and 424. In such a scheme, the error correction code generator 400 utilizes a Swap access mechanism to access the two SRAMs 412 and 414. Specifically, the operating device 420 reads $R^{k-1}_{i,j}$ from one of the two SRAMs of the buffer 410 and writes the operating result $R^{k-1}_{i,j}+B_{(16 \times k+i),j}$ into the other SRAM of the buffer 410.

Figure 5:
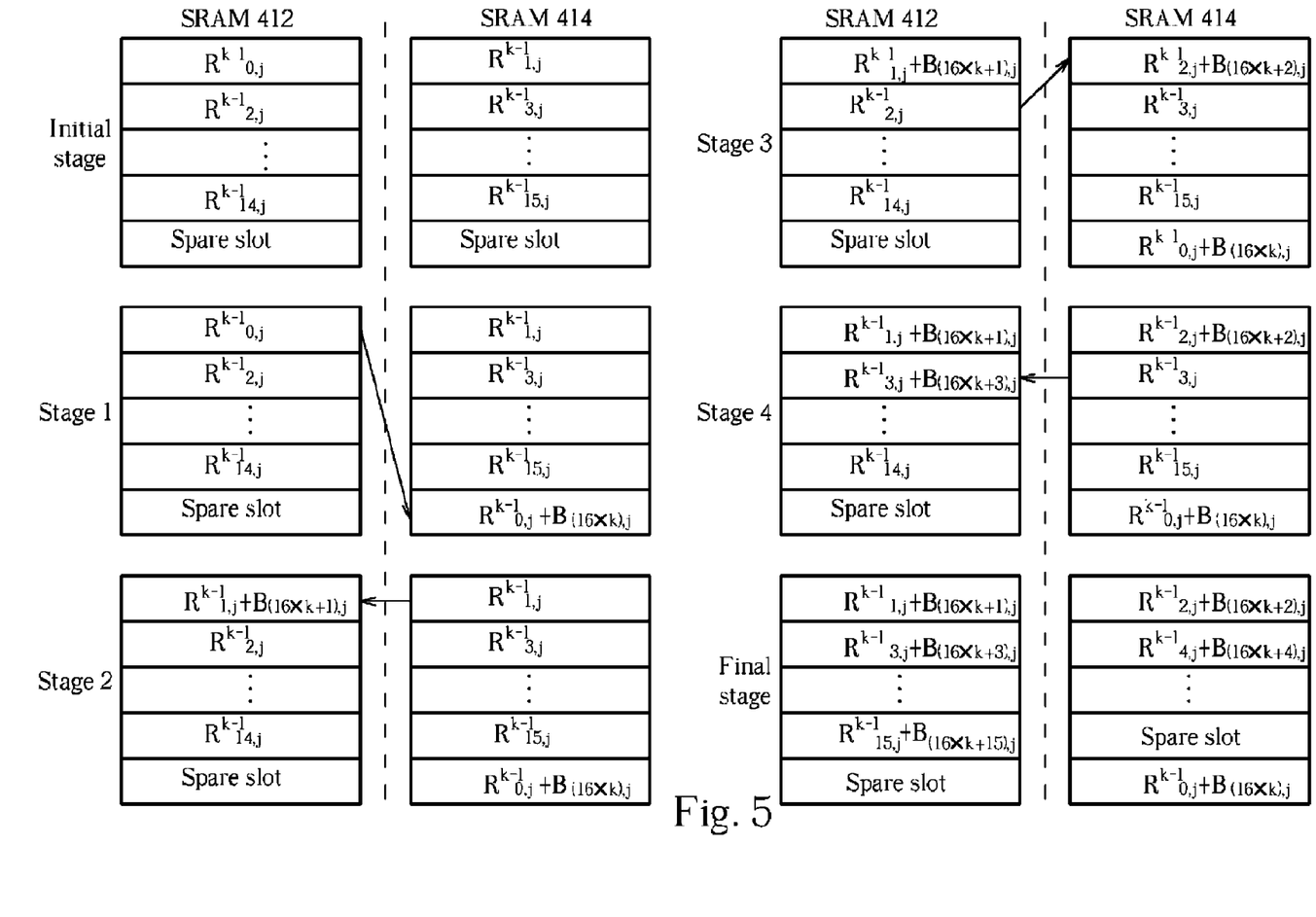
FIG. 5 is a schematic diagram illustrating the access of the buffer shown in FIG. 4.

FIG. 5 is a schematic diagram illustrating the access of the buffer 410 shown in FIG. 4. As illustrated, in the initial stage, $R^{k-1}_{0,j}, R^{k-1}_{2,j}, \ldots,$ and $R^{k-1}_{14,j}$ are stored in the SRAM 412 while $R^{k-1}_{1,j}, R^{k-1}_{3,j}, \ldots,$ and $R^{k-1}_{15,j}$ are stored in the SRAM 414. Each of the SRAMs 412 and 414 has a spare slot. In stage 1, the summing circuit 424 reads out $R^{k-1}_{0,j}$ from the SRAM 412, sums up it with $B_{(16 \times k),j}$, and then writes the summed result $R^{k-1}_{0,j}+B_{(16 \times k),j}$ into the spare slot of the SRAM 414. In stage 2, the summing circuit 422 reads out $R^{k-1}_{1,j}$ from the SRAM 414, sums up it with $B_{(16 \times k+1),j}$, and then overwrites $R^{k-1}_{0,j}$ in the SRAM 412 with the summed result $R^{k-1}_{1,j}+B_{(16 \times k+1),j}$. In stage 3, the summing circuit 424 reads out $R^{k-1}_{2,j}$ from the SRAM 412, sums up it with $B_{(16 \times k+2),j}$, and then overwrites $R^{k-1}_{1,j}$ in the SRAM 414 with the summed result $R^{k-1}_{2,j}+B_{(16 \times k+2),j}$. In stage 4, the summing circuit 422 reads out $R^{k-1}_{3,j}$ from the SRAM 414, sums up it with $B_{(16 \times k+3),j}$, and then overwrites $R^{k-1}_{2,j}$ in the SRAM 412 with the summed result $R^{k-1}_{3,j}+B_{(16 \times k+3),j}$. The operating device 420 repeats the above Swap access operation on the two SRAMs 412 and 414 until the operating results $R^{k-1}_{i,j}+B_{(16 \times k+i),j}$ for i=0~15 are stored in the buffer 410.

In accordance with the aforementioned descriptions, it can be derived that the two SRAMs 412 and 414 of the buffer 410 alternately store the operating results generated by the operating device 420. After the final stage, the operating results $R^{k-1}_{1,j}+B_{(16 \times k+1),j}$, $R^{k-1}_{3,j}+B_{(16 \times k+3),j}, \ldots,$ and $R^{k-1}_{15,j}+B_{(16 \times k+15),j}$ are stored in the SRAM 412, and the operating results $R^{k-1}_{0,j}+B_{(16 \times k),j}$, $R^{k-1}_{2,j}+B_{(16 \times k+2),j}, \ldots,$ and $R^{k-1}_{14,j}+B_{(16 \times k+14),j}$ are stored in another SRAM 414. The operations of the encoder 430 are similar to the encoder 230 described previously, and further details are therefore omitted here for brevity.

Figure 6:
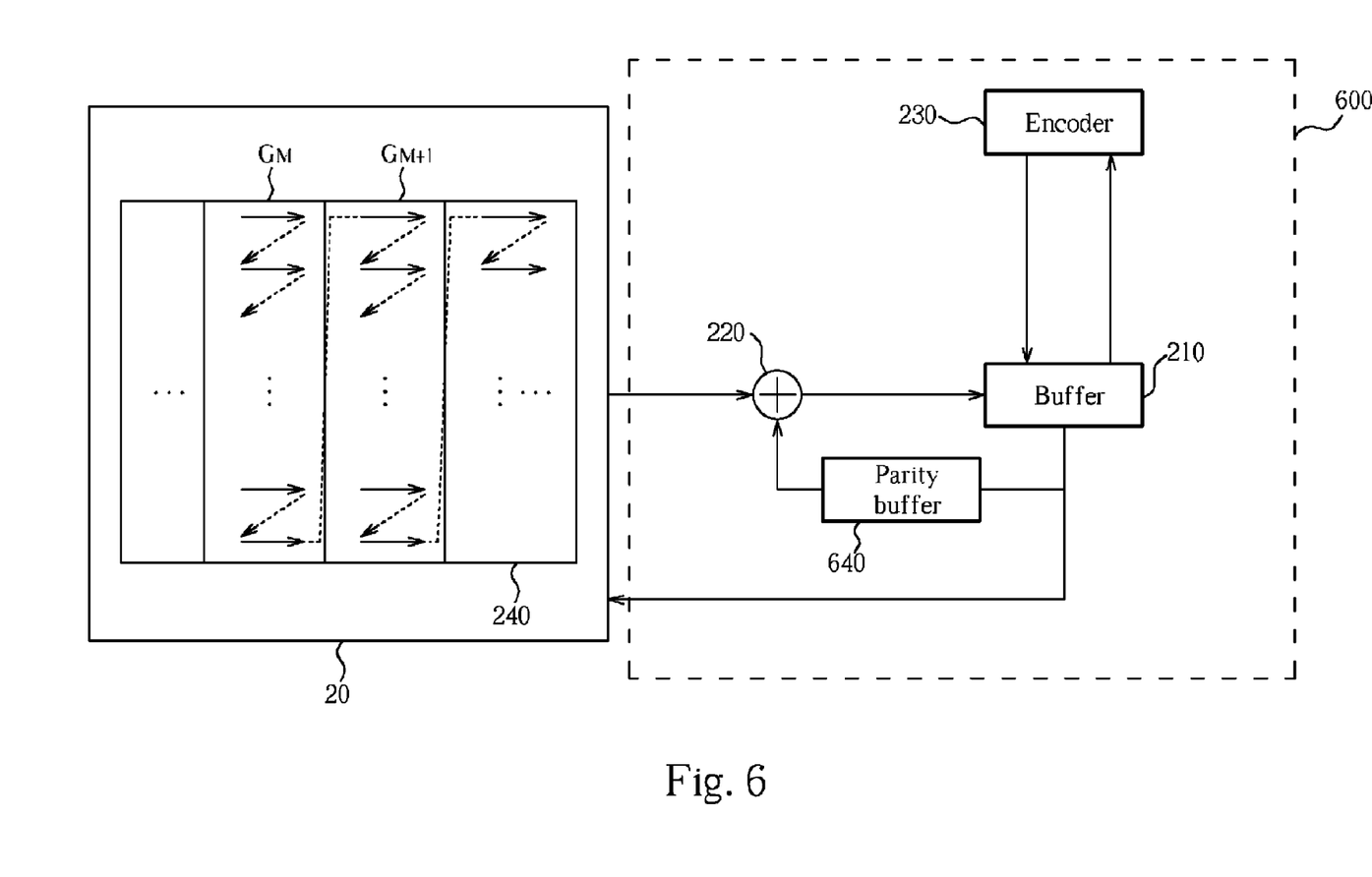
FIG. 6 shows a simplified block diagram of an error correction code generator according to a third embodiment of the present invention.

FIG. 6 shows a simplified block diagram of an error correction code generator 600 according to a third embodiment of the present invention. The error correction code generator 600 is similar to the error correction code generator 200, and components having the same operations and implementations are labeled the same for the sake of clarity. A difference between the error correction code generator 600 and the error correction code generator 200 is that the error correction code generator 600 further comprises a parity buffer 640, which is arranged and disposed between the buffer 210 and the operating device 220, for buffering calculating data to be transmitted from the buffer 210 to the operating device 220. The parity buffer 640 can be designed to have a relative smaller capacity than the buffer 210. In practical implementations, the parity buffer 640 may be realized by the D-flip-flops (DFFs) that can be shared with original parity registers of the encoder 230, so that no extra hardware cost is required. In such a design, the buffer 210 can be realized by a single one-port SRAM without significantly increasing the total latency of the PO encoding operation.

It is noted that once data of the data row $RW_i$ in the memory 20 is available, the aforementioned PO encoding methods can be immediately performed by the disclosed error correction code generator 200, 400, or 600 to generate corresponding PO codes. In other words, the disclosed PO encoding methods can be performed concurrently while the data block 240 is transmitted from a host end to the memory 20. Additionally, the proposed error correction code generation method can be performed on a whole data block or on a portion of data columns of the data block to be encoded. For example, the aforementioned data group $G_M$ can be the whole data block.

In addition, the encoder of the conventional error correction code generator is typically designed to process a whole column of the data block to be encoded at a time, so the encoder needs to wait the data received from a host end are sufficient to perform the PO encoding operation. For example, the conventional condition to start the PO encoding operation is that the scramble index of the system needs to lead the PO index with at least 16 sectors, i.e., the size of one data block. To improve the encoding performance of the error correction code generator, the equation (2) can be modified as follows:

$$R_j^k(x) = \left( \sum_{i=0}^{11} (R_{i,j}^{k-1} + B_{(12 \ast k+i),j}) x^{11-i} \right) x^{16} \bmod G_{po}(x) \quad (3)$$

where $R^{-1}_j(x)=0$ and $R^{15}_j(x)=R_j(x)$

The term $B_{(12 \ast k+i),j}$ of equation (3) is the data of the scramble sector with index k. The equation (3) is helpful to make each scrambled sector can be directly taken to update its corresponding parity codes without waiting the subsequent sectors in the same data block to be encoded are received completely.

Figure 7:
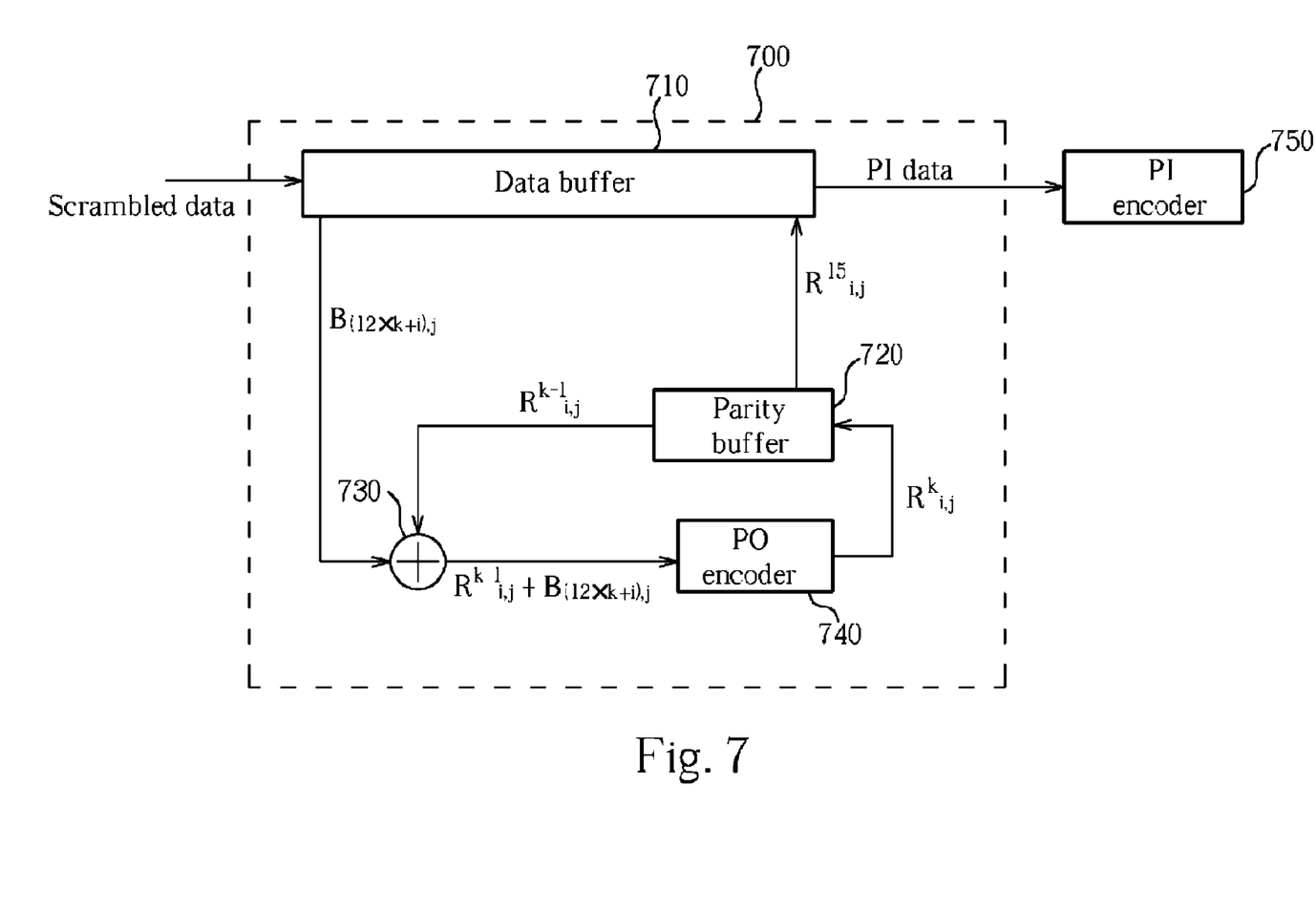
FIG. 7 illustrates a simplified block diagram of an error correction code generator according to a fourth embodiment of the present invention.

FIG. 7 illustrates a simplified block diagram of an error correction code generator 700 according to a fourth embodiment of the present invention. In this embodiment, the error correction code generator 700 is utilized for generating corresponding PO codes for a data block according to the equation (3). As illustrated, the error correction code generator 700 comprises a data buffer 710; a parity buffer 720; an operating device 730 coupled to the data buffer 710 and the parity buffer 720; and a PO encoder 740 coupled to the parity buffer 720 and the operating device 730. Operations of the components of the error correction code generator 700 are described below.

In the error correction code generator 700, the data buffer 710 is arranged for storing a plurality of data rows of a data block to be encoded. In one embodiment, the plurality of the data rows stored in the data buffer 710 is a scrambled sector of the data block to be encoded. The parity buffer 720 is arranged for storing a plurality of calculating data corresponding to the error correction codes in the column direction of the data block. In this embodiment, the parity buffer 720 is for storing the term $R^k_{i,j}$ of equation (3) corresponding to the data block.

The operating device 730 is arranged for performing a predetermined operation on the calculating data $R^{k-1}_{i,j}$ read from the parity buffer 720 and corresponding data $B_{(12 \times k+i),j}$ read from the data buffer 710. The operations and implementations of the operating device 730 are substantially the same as the operating device 220 described previously. The PO encoder 740 then generates a plurality of updated calculating data $R^k_{i,j}$ according to the operating results $R^{k-1}_{i,j}+B_{(12 \times k+i),j}$ obtained by the operating device 730. In this embodiment, the PO encoder 740 further writes the plurality of updated calculating data $R^k_{i,j}$ into the parity buffer 720 to overwrite the original calculating data $R^{k-1}_{i,j}$ stored in the parity buffer 720. In a preferred embodiment, the parity buffer 720 is implemented with a SRAM or a combination of SRAMs.

In operations, the data buffer 710 and the operating device 730 repeat same operations for a subsequent scrambled sector of the data block if the current scrambled sector is not the last scrambled sector of the data block.

Due to the computation latency between the PO index and the scramble index can be reduced from 16 sectors to 1 sector, one advantage of such architecture is that an effect similar to extend the data buffer with 15 sectors (about 30 KB) is obtained. This is quite helpful to reduce the required buffer size, especially when the data buffer 710 is realized by an embedded memory, such as an SRAM, and the memory size significantly increases the hardware cost.

Figure 8:
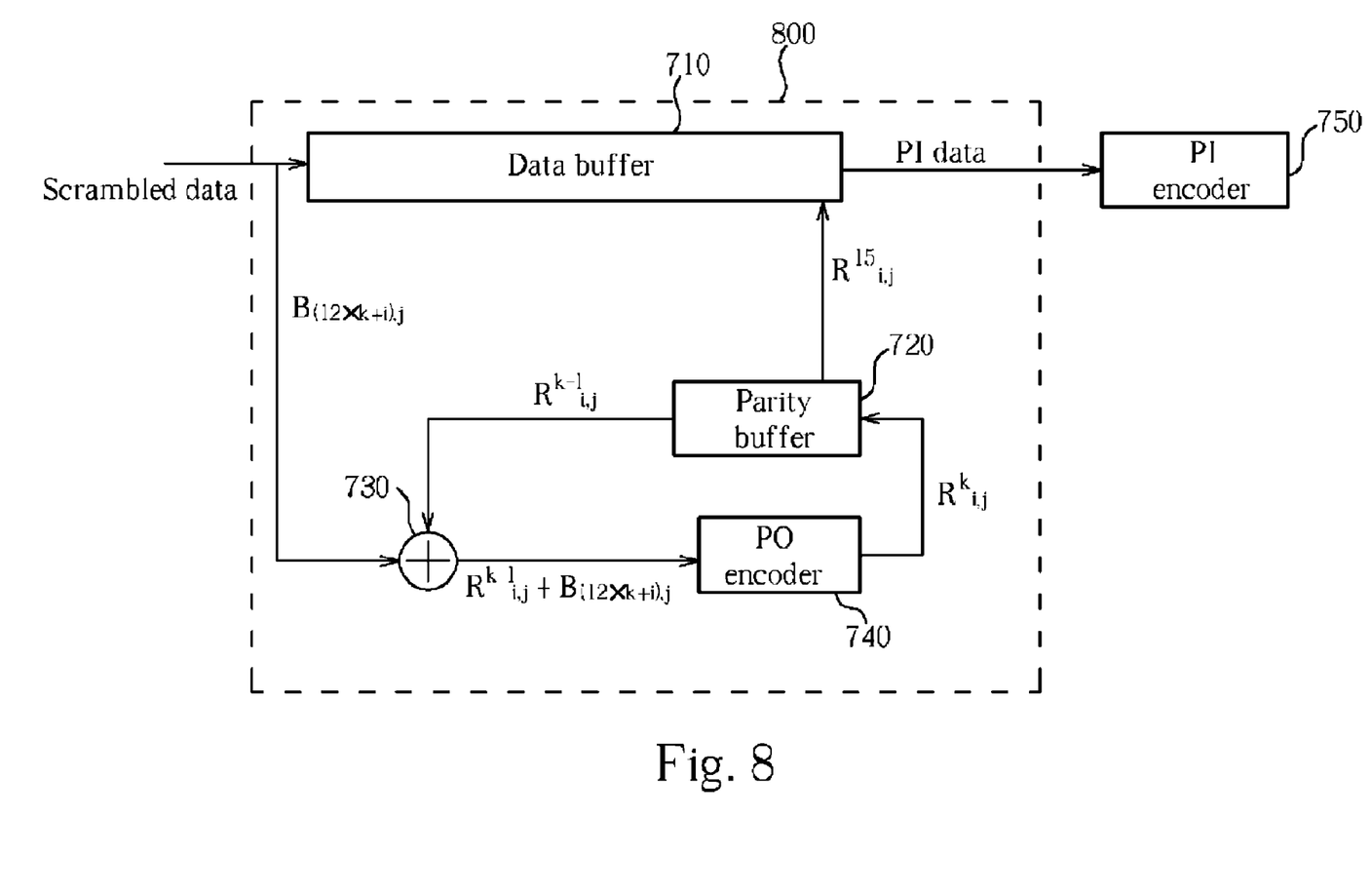
FIG. 8 is a simplified block diagram of an error correction code generator according to a fifth embodiment of the present invention.

FIG. 8 shows a simplified block diagram of an error correction code generator 800 according to a fifth embodiment of the present invention. The error correction code generator 800 is similar to the error correction code generator 700, and components having the same operations and implementations are labeled the same for the sake of clarity. One difference between the error correction code generator 800 and the error correction code generator 700 is that the scrambled data is concurrently sent to both the data buffer 710 and the operating device 730. That is, the input data $B_{(12 \times k+i),j}$ of the operating device 730 of the error correction code generator 800 is from the input of the error correction code generator 800 rather than the output of the data buffer 710. One advantage of the error correction code generator 800 is that the access of the data buffer 710 is reduced that can avoid the lack of access bandwidth of the data buffer 710.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An error correction code generator for generating error correction codes corresponding to a first direction of a data block, the error correction code generator comprising:
   a buffer for storing a plurality of calculating data corresponding to the error correction codes;
   an operating device coupled to the buffer for generating operating results according to the calculating data from the buffer and corresponding data of the data block, and writing operating results into the buffer; and
   an encoder coupled to the buffer for generating a plurality of updated calculating data according to the operating results stored in the buffer.

2. The error correction code generator of claim 1, wherein the operating device accesses the corresponding data along a second direction of the data block.

3. The error correction code generator of claim 2, wherein the first direction is the column direction of the data block and the second direction is the row direction of the data block.

4. The error correction code generator of claim 2, wherein the operating device accesses the corresponding data of the data block from a dynamic random access buffer (DRAM).

5. The error correction code generator of claim 1, wherein the error correction codes are the parity outer codes of Reed-Solomon product code.

6. The error correction code generator of claim 1, wherein the operating device comprises:
   a summing circuit for summing up the calculating data with the corresponding data of the data block.

7. The error correction code generator of claim 1, wherein the encoder further writes the updated calculating data into the buffer.

8. The error correction code generator of claim 7, wherein the encoder overwrites the operating results in the buffer with the updated calculating data.

9. The error correction code generator of claim 1, wherein the operating device overwrites the calculating data in the buffer with the operating results.

10. A method for generating error correction codes corresponding to a first direction of a data block, comprising:
    storing a plurality of calculating data corresponding to the error correction codes in a buffer;
    generating operating results according to the calculating data from the buffer and corresponding data of the data block;
    writing operating results into the buffer; and
    generating a plurality of updated calculating data according to the operating results stored in the buffer.

11. The method of claim 10, wherein the corresponding data is accessed along a second direction of the data block.

12. The method of claim 11, wherein the first direction is the column direction of the data block and the second direction is the row direction of the data block.

13. The method of claim 11, wherein the corresponding data of the data block is accessed from a dynamic random access buffer (DRAM).

14. The method of claim 10, wherein the error correction codes are the parity outer codes of Reed-Solomon product code.

15. The method of claim 10, wherein the step of generating operating results comprises:

summing up the calculating data with the corresponding data of the data block.

16. The method of claim 10, further comprising:

writing the plurality of updated calculating data into the buffer.

17. The method of claim 16, wherein the step of writing the plurality of updated calculating data comprises:

overwriting the operating results in the buffer with the plurality of updated calculating data.

18. The method of claim 10, wherein the step of writing operating results comprises:

overwriting the plurality of calculating data in the buffer with the operating results.

19. An error correction code generator for generating error correction codes corresponding to a data block, the generator comprising:

a first buffer for storing a plurality of data of the data block;

a second buffer for storing a plurality of calculating data corresponding to the error correction codes;

an operating device, coupled to the first buffer and the second buffer, for generating operating results according to the calculating data from the second buffer and the plurality of data from the first buffer; and an encoder coupled to the operating device for generating a plurality of updated calculating data according to the operating results.

20. The error correction code generator of claim 19, wherein the operating device comprises:

a summing circuit for summing up the calculating data with the plurality of data.

21. The error correction code generator of claim 19, wherein the encoder further writes the updated calculating data into the second buffer.

22. The error correction code generator of claim 21, wherein the encoder overwrites original calculating data in the second buffer with the updated calculating data.

23. A method for generating error correction codes corresponding to a data block, comprising:

storing a plurality of data of the data block in a first buffer;

storing a plurality of calculating data corresponding to the error correction codes in a second buffer;

generating operating results according to the calculating data from the second buffer and the plurality of data from the first buffer; and generating a plurality of updated calculating data according to the operating results.

24. The method of claim 23, wherein the step of generating operating results comprises:

summing up the calculating data with the plurality of data.

25. The method of claim 23, further comprising:

writing the plurality of updated calculating data into the second buffer.

26. The method of claim 25, wherein the step of writing the plurality of updated calculating data comprises:

overwriting original calculating data in the second buffer with the plurality of updated calculating data.

\* \* \* \* \*